United States Patent [19]
Gabara

[11] Patent Number: 5,097,148
[45] Date of Patent: Mar. 17, 1992

[54] INTEGRATED CIRCUIT BUFFER WITH IMPROVED DRIVE CAPABILITY

[75] Inventor: Thaddeus J. Gabara, North Whitehall Township, Lehigh County, Pa.

[73] Assignee: AT&T Bell Laboratories, Murray Hill, N.J.

[21] Appl. No.: 514,647

[22] Filed: Apr. 25, 1990

[51] Int. Cl.[5] .............. H03K 17/16; H03K 17/06; H03K 17/687; H03K 19/003

[52] U.S. Cl. .................. 307/443; 307/542; 307/475; 307/451; 307/263

[58] Field of Search ............ 307/451, 270, 579, 585, 307/475, 578, 443, 452, 453, 450, 448, 542, 482, 263

[56] References Cited

U.S. PATENT DOCUMENTS

| | | | |
|---|---|---|---|
| 4,258,272 | 3/1981 | Huang | 307/475 |
| 4,479,067 | 10/1984 | Fujita | 307/475 |
| 4,758,743 | 7/1988 | Dehganpour et al. | 307/443 |
| 4,760,283 | 7/1988 | Weaver | 307/443 X |
| 4,918,339 | 4/1990 | Shigeo et al. | 307/542 |
| 4,959,565 | 9/1990 | Knecht et al. | 307/542 |
| 4,961,010 | 10/1990 | Davis | 307/542 X |

*Primary Examiner*—Edward P. Westin
*Assistant Examiner*—David R. Bertelson
*Attorney, Agent, or Firm*—James H. Fox

[57] ABSTRACT

An output buffer provides for additional current sinking or sourcing capability by switching in an additional transistor when the output voltage passes a given level. This allows the output buffer to supply DC current to a load without requiring an excessively large AC drive capability, which could undesirably increase switching noise. In a typical embodiment, an inverter senses when the buffer output voltage reaches its switching threshold (approximately $V_{DD}/2$), and turns on the additional transistor after a given delay. For example, a CMOS output buffer driving a TTL load may obtain additional current sinking capability by this technique. On-chip buffers (e.g., bus drivers and clock drivers) can also benefit from this technique.

11 Claims, 2 Drawing Sheets

5,097,148

INTEGRATED CIRCUIT BUFFER WITH IMPROVED DRIVE CAPABILITY

BACKGROUND OF THE INVENTION

1. Field of the Invention

The present invention relates to an integrated circuit having a buffer with improved current drive capability.

2. Description of the Prior Art

Integrated circuit output buffers are used to drive external conductors with signals generated by the integrated circuit (IC). For this purpose, an estimate is made of the maximum load that is to be driven by the integrated circuit. This load includes the distributed capacitance of the external conductors, and the input capacitance of the circuitry connected thereto. The drive capability of the buffer is designed to be sufficient to charge and discharge that capacitance sufficiently rapidly to obtain the desired performance. In addition, the design must take into account the DC current sinking (and sourcing) required to drive the load. For example, when driving TTL (i.e., transistor transistor logic) inputs, the output buffer must sink approximately 0.8 to 4 milliamps per driven input. In the prior art, these requirements have been met by designing the transistors in the output buffer to be sufficiently large so as to supply both the capacitive (AC) drive capability, and the DC drive capability simultaneously.

Unfortunately, as the speed of digital (e.g., binary) logic circuits increase, the noise generated by the output buffers also increases. This is due to the faster rise and fall times of the buffers, and the greater capacitive current flow. The noise may be transmitted by capacitive coupling between conductors, or result from "ground bounce" caused by the inductance of power supply conductors, for example. Therefore, steps have been taken to minimize the noise problem. One technique is to control the rise and fall times of the output buffers, to compensate for variations in the IC production process. As a result, buffers produced in a "fast" process (i.e., a variation from the nominal process that causes relatively fast circuit speeds) may not generate excessive noise. For example, one technique to maintain relatively constant rise and fall times is described in U.S. Pat. No. 4,823,029 co-assigned herewith. Other factors influencing circuit speed that may be compensated include the operating temperature and the voltage applied to the integrated circuit.

However, the requirement for sinking or sourcing relatively large DC currents at increasingly high speeds makes it desirable to develop improved integrated circuit buffer designs. Furthermore, even output buffers that do not supply large DC currents, as when driving only CMOS loads, can benefit from improvements in noise reduction techniques. The requirements for on-chip buffers, for example bus drivers and clock drivers, have also increased. That is, as the clock rates increase, and the length of the driven conductors increase, there is a greater possibility that excessive noise will be generated.

SUMMARY OF THE INVENTION

I have invented an integrated circuit buffer that provides for improved current drive capability. The buffer includes circuitry, which may include an inverter, that senses when the buffer output voltage passes a given threshold. An additional transistor is then switched into the output circuit to supply additional current drive capability. The additional current drive may be for sinking or sourcing DC currents. Alternatively, the additional drive may supply AC current, or both AC and DC current. The design allows the size of the AC drive transistors to remain relatively small, so that switching noise is minimized.

DETAILED DESCRIPTION

Figure 1:
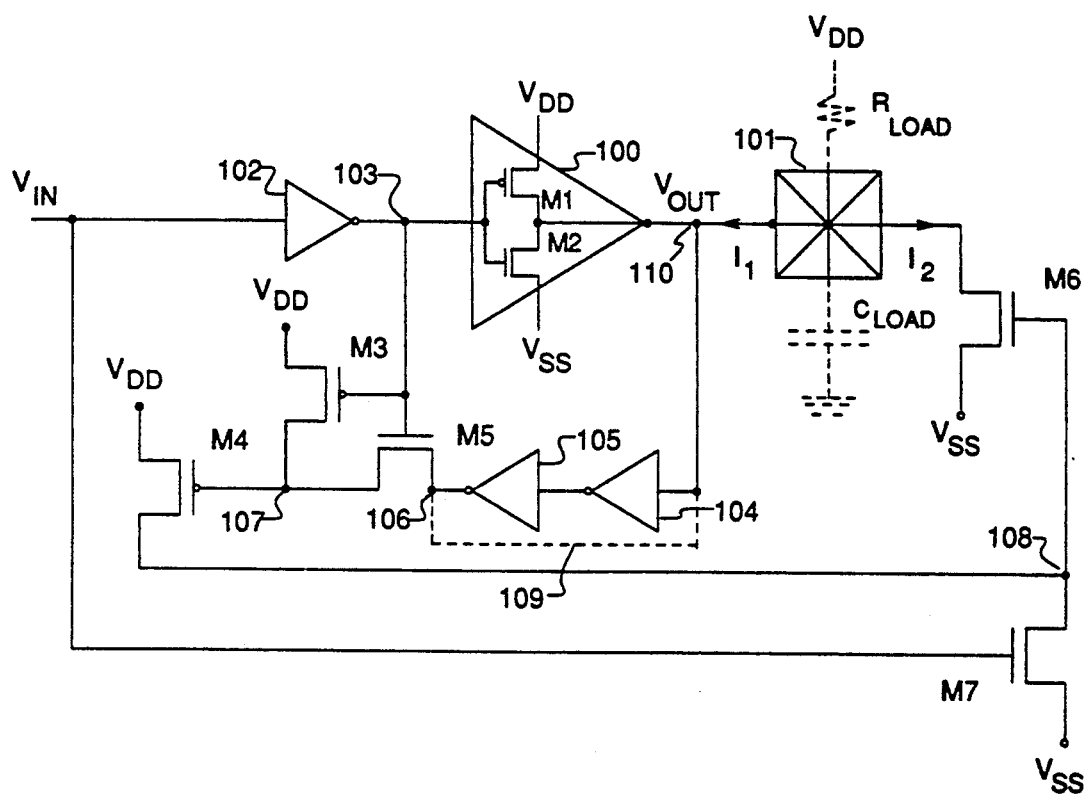
FIG. 1 shows an embodiment of the invention, whereby additional DC sinking current is supplied.

The present detailed description relates to an integrated circuit buffer having improved drive capability for digital signals. Referring to FIG. 1, an illustrative embodiment of the present invention that implements a binary output buffer in CMOS technology is shown. The output buffer comprises an output inverter 100 that includes p-channel pull-up transistor M1 and n-channel pull-down transistor M2 having their drains coupled to the output node 110 and bondpad 101. The load that the output buffer is designed to drive includes a capacitance $C_{load}$. This capacitance typically includes the distributed capacitance of external conductors connected to the bondpad, as well as the input capacitance of other integrated circuits connected thereto. The sizes of transistors M1 and M2 are typically chosen so as to provide sufficient current drive capability to obtain the desired rise and fall times when driving $C_{load}$. This capacitive current drive is also referred to herein as the "AC drive".

In addition to the capacitive load, a significant resistive load may exist in some applications. For example, the inputs of transistor-transistor logic (TTL) integrated circuits present a resistive component that may be modelled as a pull-up resistor. The sum of these components are shown as $R_{load}$ in FIG. 1, and require a corresponding pull-down current drive capability from the output buffer. This resistive current drive is also referred to herein as the "DC drive". In the prior art, the size of the output buffer transistor (e.g., M2 in FIG. 1) would be sufficient to drive the resistive load also. In the present invention, at least a portion of the DC drive, and in some cases a portion of the AC drive also, is supplied through an additional transistor. In the embodiment of FIG. 1, this additional transistor is M6, which is turned on to supply additional current sinking capability when the output signal $V_{OUT}$ (at node 110) falls below a given value. The point at which additional transistor M6 is turned on is discussed further below for the illustrative cases of driving a TTL load and a CMOS load, with still other loads being possible.

The operation of the embodiment of FIG. 1 will first be described for the case of driving a TTL load, wherein a significant DC current must be sunk by the output buffer. When signal $V_{IN}$ goes below the switching threshold of inverter 102 (typically $V_{DD}/2$), the output of inverter 102 (node 103) goes high, so that pass transistor M5 conducts. Furthermore, the output inverter 100 switches, so that the output voltage on the buffer output node 110 goes low. This output voltage is applied to the input of inverter 104. Therefore, after a delay determined by the propagation time through inverters 104 and 105, the voltage at node 106 goes low, pulling the voltage at node 107 low through M5. This causes p-channel transistor M4 to conduct, placing a high voltage ($V_{DD}$) on the gate of M6. The high voltage on the gate of M6 causes it to conduct, so that a portion of the load current (I2) flows through M6 to $V_{SS}$. Since the current flow is from a more positive voltage ($V_{DD}$) through the load $R_{load}$ to ground ($V_{SS}$), this conduction of M6 provides additional current sinking capability. When $V_{IN}$ returns to a high voltage state, node 103 goes low, allowing M3 to conduct. This places a high voltage on the gate of M4, so that it turns off. Furthermore, the high $V_{IN}$ causes M7 to conduct, thereby placing a low voltage on the gate of M6, causing M6 to turn off. The high $V_{IN}$ also causes the output buffer 100 to pull the output node 110, and hence bondpad 101, high.

Figure 2:
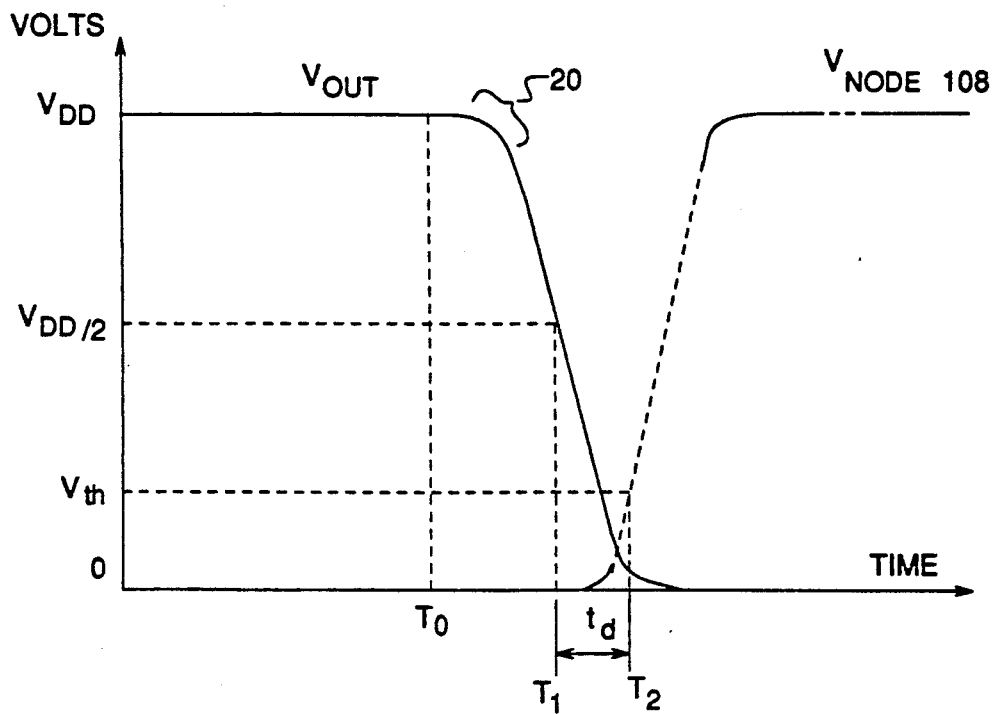
FIG. 2 shows a typical waveform generated by the embodiment of FIG. 1 designed for driving TTL loads.

Referring to FIG. 2, a graph of the buffer output voltages ($V_{OUT}$), and the voltage on the gate of M6 (node 108) is shown as a function of time. The waveforms are typical of the case of driving a TTL load. After $V_{IN}$ goes low at time $T_0$, $V_{OUT}$ also begins to decrease, due to the action of output inverter 100. When $V_{OUT}$ falls below the switching threshold of inverter 104 (e.g., $V_{DD}/2$) at $T_1$, the inverter 104 switches high. Inverters 104 and 105 delay the time that the voltage on node 108 reaches the threshold of M6 ($V_{th}$), and hence the turn-on of M6, until time $T_2$. This delay $t_d$ ($T_2-T_1$) is designed to ensure that the additional current sinking capability is provided after the output voltage is brought relatively low, typically within about 1 volt of the low state. Hence, no substantial additional AC current flow is produced, and no substantial additional switching noise results, from the additional current sinking capability. That is, the current sinking capability shown in FIG. 2 is obtained without changing the "knee" (region 20) of the output voltage waveform. If, on the other hand, the output inverter transistors (e.g., M2) were sized sufficiently large to provide all the current drive capability (I1+I2), then the knee of the output waveform would be so sharp that excessive noise might be generated.

As noted above, in the illustrative embodiment, the additional drive is provided when the output voltage falls below the switching threshold of inverter 104. That threshold can be chosen by the size ratios of the complementary transistors in inverter 104 in a manner well known in the art. I recommend that when driving TTL loads, the threshold for providing the additional output current be in the range of from 0.2 to 0.8 of the power supply voltage supplied to the buffer ($V_{DD}$), and typically about $V_{DD}/2$. Furthermore, I recommend that the switching threshold and the delay $t_d$ be chosen so that the additional current sinking, due to the turn-on of M6, occurs when the output voltage transitions to less than 25 percent of the power supply voltage applied to the output inverter. This value of the output voltage is therefore less than 1.25 volts in the case of a 5 volt power supply applied to the output inverter shown in FIG. 1. Note that to obtain a given desired turn-on voltage for M6, as the switching threshold of inverter 104 decreases, the time delay $t_d$ that is required also decreases, and vice versa.

While the illustrative embodiment has shown an n-channel field effect transistor that provides additional current sinking capability, it is alternatively possible to use a p-channel transistor to provide additional current sourcing capability in an analogous manner. In that case, the conductivity types of transistors M3 ... M6 would be the opposite of those shown in FIG. 1, and the connections to $V_{DD}$ and $V_{SS}$ would be interchanged from those shown. The additional current sourcing capability may be useful, for example, when driving transmission type conductors that are terminated by resistive loads connected to ground ($V_{SS}$). Furthermore, it is possible to provide both additional current sinking and current sourcing capability, which may also be useful for some types of loads. This may be accomplished by providing both an additional n-channel transistor and an additional p-channel transistor, with the appropriate control circuitry as described.

Figure 3:
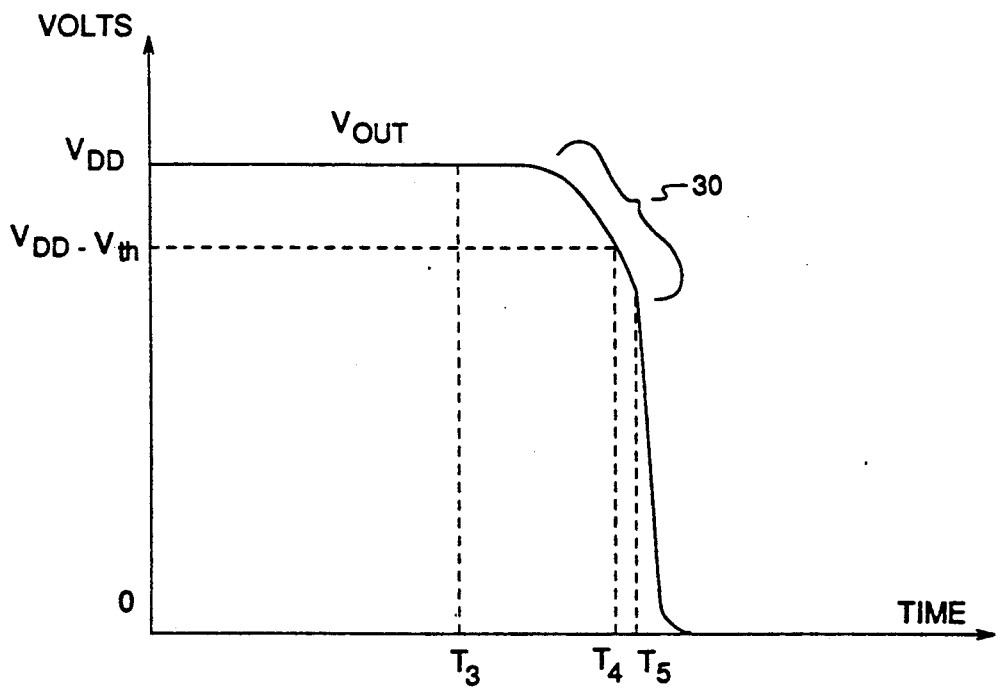
FIG. 3 shows a typical waveform generated by the alternate embodiment of FIG. 1 for driving CMOS loads.

In a second illustrative embodiment, the present technique may be used for an output buffer driving MOS (including CMOS) loads. In that case, there may be no substantial DC current flow required, but it is still desirable to reduce buffer switching noise while preserving relatively fast rise and fall times. Referring again to FIG. 1, the delay circuit comprising inverters 104, 105 is omitted, and the output node 110 (and bondpad 101) is connected directly to transistor M5 by conductor 109. This substantially reduces the delay in the turn-on of additional transistor M6, which occurs shortly after the output voltage $V_{OUT}$ on bondpad 101 falls below the threshold of p-channel transistor M4. Referring to FIG. 3, after the input voltage $V_{IN}$ goes low at $T_3$, the output voltage $V_{OUT}$ begins to fall. $V_{OUT}$ passes below the threshold of transistor M4 ($V_{DD}-V_{th}$) at time $T_4$. The additional transistor M6 turns on at $T_5$, which is shortly thereafter. The delay time $t_d$ ($T_5-T_4$) in this case may be sufficiently small as to be considered negligible in practice. After time $T_5$, the output voltage $V_{OUT}$ falls rapidly to the low state (0 volts).

Hence, in this embodiment for driving MOS loads, the additional transistor M6 provides conduction of AC current; that is, capacitive current from the external conductors and inputs of other MOS integrated circuits. However, it can be seen from FIG. 3 that even without a significant delay, the additional current conduction may occur later than the majority of the knee 30. Hence, relatively low noise is generated by the switching of the output buffer, while still obtaining a relatively rapid fall time for $V_{OUT}$. In the case of a CMOS output buffer, a circuit comparable to FIG. 1 is typically also provided for an additional pull-up transistor, by interchanging transistor conductivity types as noted above. This is because CMOS loads typically switch near the mid point of the power supply voltage, and do not present an asymmetric DC load, as in the case of the TTL output buffer. Note also that the relatively high noise immunity of CMOS circuits, as compared to TTL circuits, is advantageous in this embodiment of the invention.

An additional advantage of the present invention is that the operation of the additional transistor is controlled by the voltage on the output node 110. Hence, there is practically no additional capacitive load at the input of the output inverter, node 103, due to the additional transistor. Any additional capacitance at node 103 would undesirably decrease the switching speed, and hence the performance, of the output buffer. While the present invention provides for an improved drive capability without a corresponding increase in buffer switching noise, still additional noise control techniques are desirable in some cases. For example, the above-noted technique of U.S. Pat. No. 4,823,029 may advantageously be used with the present invention, with still other noise control techniques being possible.

Although the foregoing description have been in terms of an output buffer, other applications of the present invention are possible. For example, on-chip bus drivers and clock drivers may advantageously use this technique. In that case, the buffer output node 110 and the drain of additional transistor M6 are connected to an on-chip load, rather than to a bondpad (101) that provides for connection to an external load. In fact, the trend for larger chip sizes, and the possibility of wafer scale integration, tends to increase the conductor lengths, making the present technique useful in a wide variety of situations. All such uses are included in the meaning of "buffer" herein.

In the embodiment of FIG. 1, a CMOS output inverter is illustrated. However, in an alternate embodiment, both the pull-up and pull-down devices may be an n-channel devices. In that case, the buffer input signal is inverted with respect to the gates of the pull-up and pull-down devices. It is also possible to use a voltage-dropping transistor in series with the output inverter to lower the power supply voltage applied to the output inverter as compared to the power supply voltage applied to the integrated circuit. This may be useful, for example, for providing a 0 to 3 volt output swing as compared to the standard CMOS 0 to 5 volt output swing. Furthermore, a buffer implemented in bipolar technology can also benefit from the present technique. In that case, the output inverter typically includes a pnp pull-up transistor, and npn pull-down transistor, to supply the AC drive capability. The additional current sinking transistor then could be a npn device, provided in an analogous manner as shown for the additional n-channel device in the foregoing CMOS implementation. Alternatively, if additional current sourcing capability were desired, an additional pnp device could be provided. Still other implementations in bipolar and field effect transistor technologies exist.

I claim:

1. An integrated circuit comprising a buffer including:
   a pull-up transistor for pulling the voltage on a buffer output node toward a first power supply voltage, and a pull-down transistor for pulling the voltage on said buffer output node toward a second power supply voltage;
   wherein the pull-up and pull-down transistors operate in response to a buffer input signal;
   characterized in that said buffer further comprises an additional transistor for pulling the voltage on the output node toward a given one of the first and second power supply voltages; and means connected to said buffer output node for causing said additional transistor to conduct when the voltage on said buffer output node passes a given threshold in the range between the first and second power supply voltages.

2. The integrated circuit of claim 1 wherein said pull-up transistor is a p-channel field effect transistor having a source coupled to a positive power supply voltage node, and said pull-down transistor is a n-channel field effect transistor having a source coupled to a negative power supply voltage node.

3. The integrated circuit of claim 2 wherein said additional transistor is a n-channel field effect transistor that provides additional current sinking capability.

4. The integrated circuit of claim 2 wherein said additional transistor is a p-channel field effect transistor that provides additional current sourcing capability.

5. The integrated circuit of claim 2 wherein said means for causing said additional transistor to conduct comprises a CMOS inverter having a switching threshold in the range of from 0.2 to 0.8 of the difference of said first and second power supply voltages.

6. The integrated circuit of claim 5 wherein said means for causing said additional transistor to conduct comprises a CMOS inverter having a switching threshold of about one-half of the difference of said first and second power supply voltages.

7. The integrated circuit of claim 5 wherein said means for causing said additional transistor to conduct further comprises a delay means for allowing the buffer output voltage to transition within a given increment of said given power supply voltage before allowing said additional transistor to conduct.

8. The integrated circuit of claim 7 wherein said given increment is less than 25 percent of the difference of said first and second power supply voltages.

9. The integrated circuit of claim 1 wherein said buffer is an output buffer, with said output node being connected to a bondpad.

10. The integrated circuit of claim 1 wherein said buffer is an on-chip driver, wherein said output node is connected to a load on said integrated circuit.

11. An integrated circuit comprising a CMOS output buffer for driving TTL loads, said integrated circuit including:
   a p-channel pull-up transistor for pulling the voltage on a buffer output node toward a positive power supply voltage, and a n-channel pull-down transistor for pulling the voltage on said buffer output node toward a negative power supply voltage;
   wherein the pull-up and pull-down transistors operate in response to a buffer input signal;
   characterized in that said buffer further comprises an additional n-channel transistor for pulling the voltage on the output node toward the negative power supply voltage; and means including at least one inverter coupled to said buffer output node for causing said additional transistor to conduct when the voltage on said buffer output node passes a given threshold that is less than one-half the difference between the positive and negative power supply voltages.

* * * * *